(12) United States Patent
Tsai

(10) Patent No.: US 9,405,619 B2
(45) Date of Patent: Aug. 2, 2016

(54) METHOD FOR PERFORMING ERROR CORRECTION, ASSOCIATED MEMORY APPARATUS AND ASSOCIATED CONTROLLER THEREOF

(71) Applicant: Silicon Motion Inc., Hsinchu County (TW)

(72) Inventor: Ping-Yen Tsai, Taoyuan County (TW)

(73) Assignee: Silicon Motion Inc., Hsinchu County (TW)

( * ) Notice: Subject to any disclaimer, the term of this patent is extended or adjusted under 35 U.S.C. 154(b) by 68 days.

(21) Appl. No.: 14/455,953

(22) Filed: Aug. 11, 2014

(65) Prior Publication Data

US 2015/0186210 A1    Jul. 2, 2015

(30) Foreign Application Priority Data

Dec. 30, 2013    (TW) .............................. 102149100 A

(51) Int. Cl.
| | | |
|---|---|---|
| G11C 29/00 | (2006.01) | |
| G06F 11/10 | (2006.01) | |
| G11C 29/52 | (2006.01) | |
| G11C 16/34 | (2006.01) | |
| G11C 29/42 | (2006.01) | |
| G11C 16/26 | (2006.01) | |

(52) U.S. Cl.
CPC ........ G06F 11/1068 (2013.01); G06F 11/1012 (2013.01); G11C 16/3418 (2013.01); G11C 29/42 (2013.01); G11C 29/52 (2013.01); *G11C 16/26* (2013.01)

(58) Field of Classification Search
None
See application file for complete search history.

(56) References Cited

U.S. PATENT DOCUMENTS

| | | | |
|---|---|---|---|
| 7,746,602 B2 | 6/2010 | Gill | |
| 7,746,692 B2 | 6/2010 | Kohler | |
| 7,903,467 B2 | 3/2011 | Lee | |
| 8,059,457 B2 | 11/2011 | Perlmutter | |
| 8,504,884 B2 * | 8/2013 | Eguchi | G11C 29/42 714/721 |
| 8,508,991 B2 | 8/2013 | Yang | |

(Continued)

FOREIGN PATENT DOCUMENTS

| | | |
|---|---|---|
| TW | 200836205 | 9/2008 |
| TW | 200905692 | 2/2009 |

OTHER PUBLICATIONS

Tsung-Chieh Yang et al., Title: Method for Performing Memory Access Management, and Associated Memory Device and Controller Thereor, pending U.S. Appl. No. 14/327,580, filed Jul. 10, 2014.
Yang, Title of Invention: Method for Performing Memory Access Management, and Associated Memory Device and Controller Thereof, U.S. Appl. No. 13/944,866, filed Jul. 17, 2013.

*Primary Examiner* — Daniel McMahon
(74) *Attorney, Agent, or Firm* — Winston Hsu; Scott Margo

(57) ABSTRACT

A method for performing error correction, an associated memory apparatus and an associated controller thereof are provided. The data used in a hard decoding period can be wholly or partially reserved, and the reserved data can be used in a soft decoding period. For example, a read operation is performed at a specific physical address of a flash memory; after an uncorrectable error of the read operation is detected, a re-read operation is performed at the specific physical address of the flash memory to obtain first data and temporarily store the first data into a volatile memory, and a hard decoding operation is performed on the first data; and after decoding failure of the hard decoding operation is detected, a soft decoding operation is performed according to the first data read from the volatile memory to perform error correction corresponding to the specific physical address.

20 Claims, 8 Drawing Sheets

(56) References Cited

U.S. PATENT DOCUMENTS

| | | | |
|---|---|---|---|
| 8,656,257 B1 * | 2/2014 | Micheloni | G06F 11/1012 714/758 |
| 8,867,270 B2 | 10/2014 | Yang | |
| 9,239,685 B2 | 1/2016 | Yang | |
| 2010/0199149 A1 | 8/2010 | Weingarten | |
| 2012/0198314 A1 | 8/2012 | Yang | |
| 2013/0117640 A1 * | 5/2013 | Tai | G06F 11/1048 714/780 |
| 2013/0215678 A1 * | 8/2013 | Yang | G06F 11/1048 365/185.03 |
| 2013/0275829 A1 | 10/2013 | Sridhara | |

* cited by examiner

METHOD FOR PERFORMING ERROR CORRECTION, ASSOCIATED MEMORY APPARATUS AND ASSOCIATED CONTROLLER THEREOF

BACKGROUND OF THE INVENTION

1. Field of the Invention

The present invention relates to reading data from flash memories, and more particularly, to a method of performing error correction, an associated memory apparatus and an associated controller.

2. Description of the Prior Art

Due to the continual development of flash memory, various types of memory apparatus (e.g. SD/MCC, CF, MS, or xD memory card) and portable multimedia playback devices having flash memory (e.g. MP3 players or portable media players) have been widely adopted in various applications. How to control access to the flash memory has therefore become an issue.

In the case of NAND flash memories, a first type is called single level cell (SLC) NAND flash, and the second is called multiple level cell (MLC) NAND flash. In the SLC flash memory technology, each transistor which serves as a single memory unit only has two charge values, which are respectively used to represent logic 0 and logic 1. In the MLC flash memory technology, storage capability of each transistor which serves as a single memory unit is utilized more compactly. The MLC flash memory is driven by higher voltage such that a single transistor is able to record information of multiple bits (e.g. 00, 01, 11, and 10) by voltages of different levels. Theoretically, the storage density of MLC flash memory is more than twice that of the SLC flash memory. This is beneficial to the industry as it may help overcome the bottleneck in development of flash memory technology.

Compared to the SLC flash memory, the MLC flash memory is cheaper and provides more storage capacity in a limited size, and has therefore become the mainstream memory apparatus on the market. Instability of the MLC flash memory, however, introduces some undesirable problems. Although the related art provides some solutions to these problems, they still fail to obtain a desirable balance between performance and usage of system resources, and inevitably introduce some side effects. Therefore, there is a need for an innovation method which can manage access to the flash memory, and takes account of both performance and usage of system resources.

SUMMARY OF THE INVENTION

In order to solve the above-mentioned problem, it is an objective of the present invention to provide a method for performing error correction, an associated memory apparatus, and an associated controller.

According to a preferred embodiment of the present invention, a method for performing error correction is provided. The method is for use in a controller of a memory apparatus, the memory apparatus having a flash memory. The method comprises: performing a read operation at a specific physical address of the flash memory; after an uncorrectable error of the read operation is detected, performing a first re-read operation at the specific physical address of the flash memory by configuring a first retry parameter to the flash memory to obtain first data corresponding to the first retry parameter and temporarily storing the first data into a volatile memory and performing a first hard decoding operation on the first data; and after decoding failure of the first hard decoding operation is detected, at least according to the first data read from the volatile memory, performing a soft decoding operation to perform error correction corresponding to the specific physical address.

According to another preferred embodiment of the present invention, a memory apparatus related to the above-mentioned method is provided. The memory apparatus includes a flash memory having a plurality of blocks; and a controller for accessing the flash memory. Particularly, the controller performs a read operation at a specific address. In addition, after an uncorrectable error of the read operation is detected, the controller performs a first re-read operation at the specific physical address of the flash memory by configuring a first retry parameter to the flash memory to obtain first data corresponding to the first retry parameter. The controller temporarily stores the first data into a volatile memory and performs a first hard decoding operation on the first data. After decoding failure of the first hard decoding operation is detected, at least according to the first data read from the volatile memory, the controller performs a soft decoding operation to perform error correction corresponding to the specific physical address.

According to another preferred embodiment of the present invention, a controller for a memory apparatus is provided. The controller is employed for accessing a flash memory, and the flash memory includes a plurality of blocks. The controller comprises: a microprocessor and an error correction code engine. The microprocessor is used for executing a program code to control access to the flash memory, wherein the program code is loaded from outside or inside the controller. The error correction code engine (ECC Engine) is used for performing error correction. Particularly, the controller performs a read operation at a specific physical address of the flash memory; after an uncorrectable error of the read operation is detected, the controller performs a first re-read operation at the specific physical address of the flash memory by configuring a first retry parameter to the flash memory to obtain first data corresponding to the first retry parameter; and the controller temporarily stores the first data into a volatile memory and performs a first hard decoding operation on the first data by utilizing the ECC engine; after decoding failure of the first hard decoding operation is detected, at least according to the first data read from the volatile memory, the controller utilizes the ECC engine to perform a soft decoding operation to perform error correction corresponding to the specific physical address.

One advantage of the present invention is that error correction performance is improved. The memory apparatus or controller of the present invention may wholly or partially reserve the data used in a hard decoding period, and use the reserved data in a soft decoding period. Therefore, soft decoding based on the data that is loaded from the volatile memory can be rapidly finished, and no time is wasted waiting for the read result of the flash memory. In addition, the present invention does not need to configure a retry parameter to the flash memory in the soft decoding period, which can save more time and improve the system performance. The present invention is able to dynamically switch between soft decoding and hard decoding, which optimizes the error correction performance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
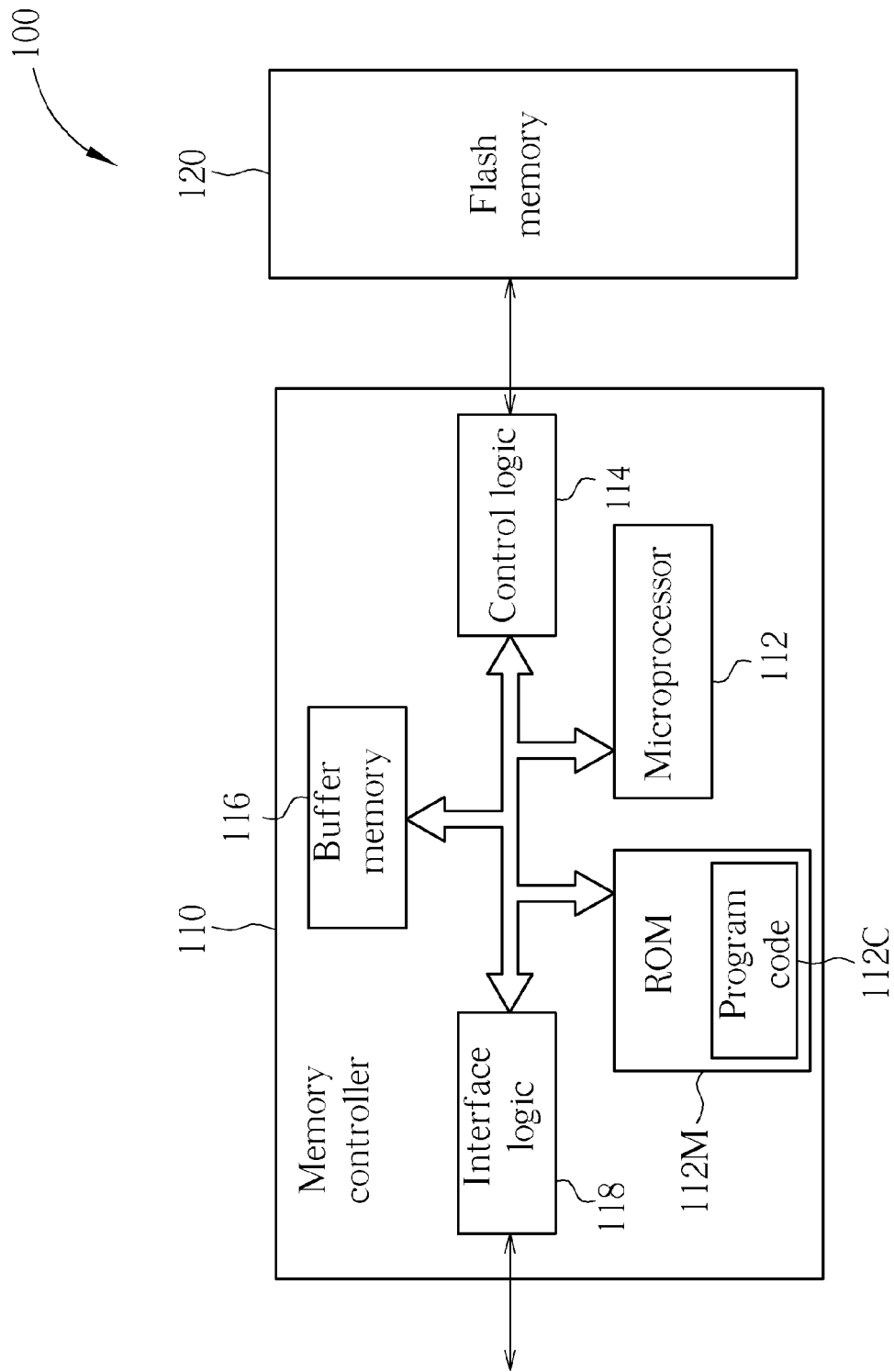
FIG. 1 is a diagram illustrating a memory apparatus according to a first embodiment of the present invention.

Please refer to FIG. 1, which is a diagram illustrating a memory apparatus 100 according to a first embodiment of the present invention. The memory apparatus 100 includes at least one part of an electronic device, wherein the electronic device could be (but is not limited to) a portable device, such as an MP3 player or a portable multimedia player. According to various embodiments of the present invention, the memory apparatus 100 could be electrically connected to the electronic device by a user, where the memory apparatus 100 could be a memory card, and the electronic device could be (but is not limited to) a device equipped with a card reader, such as a PC, PDA, cellular phone with multiple functions, or a tablet computer. According to various embodiments of the present invention, the memory apparatus 100 could be disposed in the electronic device, where the memory apparatus 100 could be a solid state drive (SSD), and the electronic device could be (but is not limited to) a personal computer such as a laptop or a desktop computer.

The memory apparatus 100 includes: a flash memory 120 that is employed for storing information or files (e.g. multimedia files); and a controller that is employed for accessing the flash memory 120. The controller could be a memory controller 110. In this embodiment, the memory controller 110 includes a microprocessor 112, a read only memory (ROM) 112M, a control logic 114, at least one buffer memory 116, and an interface logic 118. The ROM 112M is employed for storing a program code 112C, and the microprocessor 112 is employed for executing the program code 112C to control operations of the memory apparatus 100. For example, the microprocessor 112 that executes the program code 112C is able to control the operations of the memory apparatus 100, such as accessing files stored in the flash memory 120 or playback of multimedia files in the flash memory 120. Please note that the program code 112C has to be stored in, for example, the buffer memory 116, or any type of memory device.

The flash memory 120 includes a plurality of blocks, and the memory controller 110 performs data erasing operations on the flash memory 120 block by block by the microcontroller 112 executing the program code 112C. Each block is able to record a certain quantity of pages, wherein the memory controller 110 is operable to perform a writing operation on the flash memory 120, in order to write one or more pages of data into the flash memory 120.

In practice, by utilizing the microcontroller 112 to execute the program code 112C, the memory controller 110 can utilize its internal components to perform various control operations. For example, the memory controller 110 controls the access to the flash memory 120 through the control logic 114 (e.g. access to at least one block or at least one page); the use of the buffer memory 160 for necessary buffering; and the use of an interfacing logic for communicating with a host device.

In this embodiment, the memory controller 110 could include an error correction code engine (ECC Engine—not shown), which is employed for error correction. For example, the ECC Engine could be disposed in the control logic 114. In this embodiment, the memory controller 110 that executes the program code 112C can have proper use of the memory apparatus 100 and/or hardware resources of the above-mentioned electronic device to improve the performance of the ECC engine in error correction. Please refer to FIG. 2 for further details.

Figure 2:
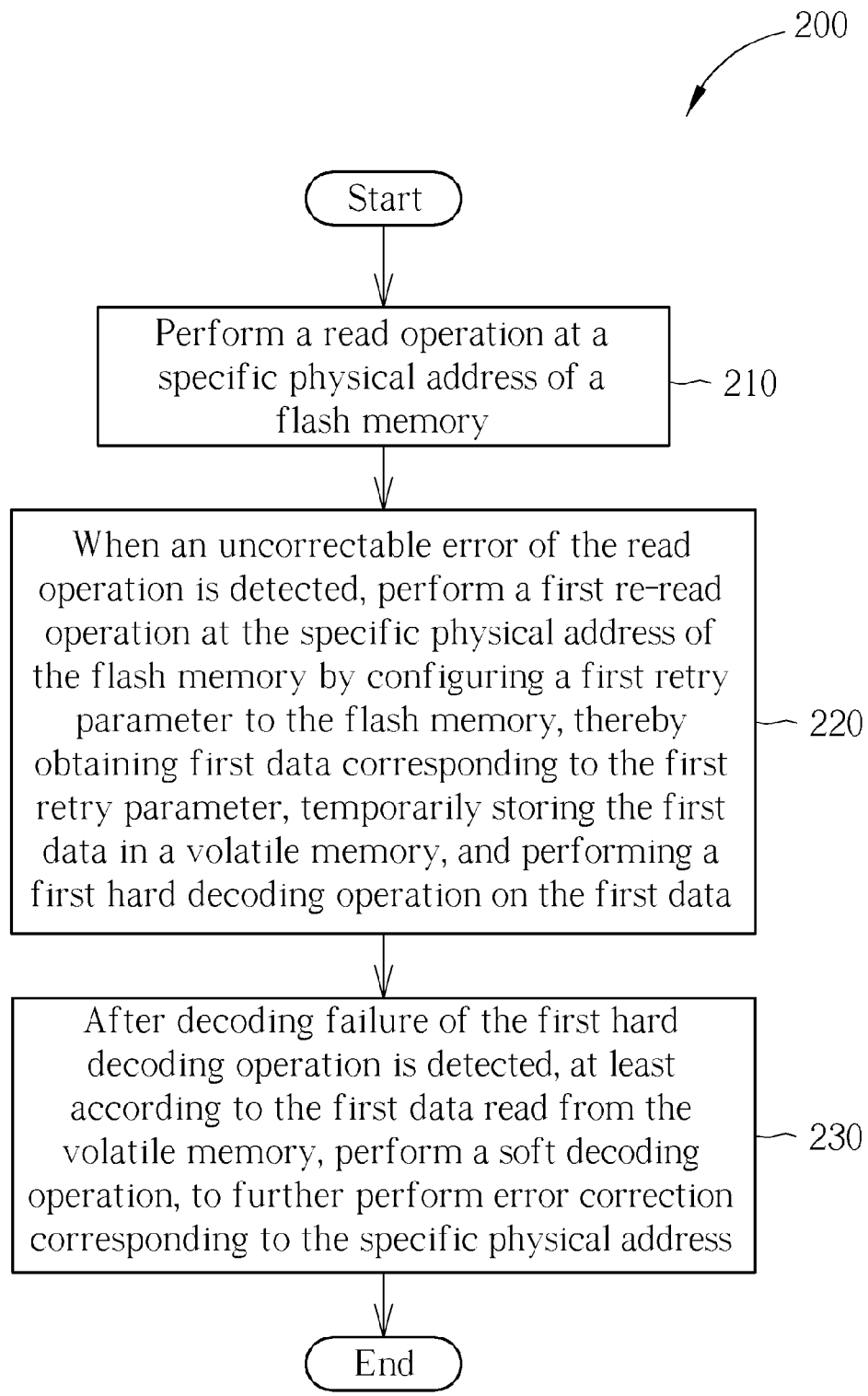
FIG. 2 is a flow chart of a method of performing error correction according to one embodiment of the present invention.

FIG. 2 is a flow chart of a method of performing error correction according to one embodiment of the present invention. This method is applicable to the memory device 100 of FIG. 1, and especially to the above-mentioned controller. For example, the memory controller 110 uses the microcontroller 112 to execute the program code 112C. The method is explained below, with reference to the steps illustrated in FIG. 2.

In step 210, the controller performs a read operation at a specific physical address of the flash memory. Particularly, according to a host command, the controller performs the read operation at the specific physical address, wherein the host command carries a logic address corresponding to the specific physical address.

In step 220, when an uncorrectable error of the read operation is detected, the controller performs a first re-read operation at the specific physical address by configuring a first retry parameter to the flash memory 120, thereby obtaining first data corresponding to the first retry parameter. The first data is temporarily stored in a volatile memory, such as a Random Access Memory (RAM). In addition, a first hard decoding operation is performed on the first data. For example, the uncorrectable error indicates a quantity of errors in a read result of the read operation exceeds a maximum quantity of errors that the ECC engine is able to correct in the read result.

In step 230, after decoding failure of the first hard decoding operation is detected, at least according to the first data read from the volatile memory, the controller employs the ECC engine to perform a soft decoding operation, to further perform error correction corresponding to the specific physical address. For example, during the period in which the error correction is performed with respect to the specific address, the controller performs another re-read operation at the specific physical address to prevent obtaining the first data corresponding to the first retry parameter. Particularly, to prevent obtaining the first data corresponding to the first retry parameter, the controller re-configures the first retry parameter to the flash memory 120.

For simplicity, the operation of step 230 is illustrated as subsequent to step 220, but this is for ease of explanation, rather than as a limitation. The controller may perform other additional operations between step 220 and step 230. The controller could perform Low Density Parity Check Code encoding/decoding, especially hard decoding and soft decoding. As the associated principles are well known to one of ordinary skill in the art, they are omitted here for the sake of brevity.

In this embodiment, after the decoding failure of the first hard decoding operation is detected, the controller could perform the soft decoding operation according to a set of data respectively corresponding to a set of retry parameters, thereby performing error correction with respect to the specific physical address. The set of retry parameters includes the first retry parameter, and the set of data includes the first data read from the volatile memory. Particularly, the soft decoding operation is performed after decoding failure of a plurality of hard decoding operations is detected. The plurality of hard decoding operations includes the first hard decoding operation. For example, the set of retry parameters could further include a second retry parameter. After the uncorrectable error is detected, the controller could perform a second re-read operation at the specific physical address by configuring the second retry parameter to the flash memory 120, thereby obtaining second data corresponding to the second retry parameter. In addition, the controller temporarily stores the second data into the volatile memory, and performs a second hard decoding operation on the second data, wherein the plurality of hard decoding operations further include the second hard decoding operation. The set of retry parameters could further include a third retry parameter. After the uncorrectable error is detected, the controller could perform a third re-read operation at the specific physical address by configuring the third retry parameter to the flash memory 120, thereby obtaining third data corresponding to the third retry parameter. In addition, the controller temporarily stores the third data into the volatile memory, and performs a third hard decoding operation on the third data, wherein the plurality of hard decoding operations further include the third hard decoding operation.

In practice, the read operation is performed based on an original parameter. Any retry parameter of the set of retry parameters differs from another retry parameter in the set, and each retry parameter of the set of retry parameters differs from the original parameter. One of the set of retry parameters corresponds to a voltage level threshold of the flash memory 120 that is different from another voltage level threshold that another of the retry parameters corresponds to. Any retry parameter of the set of retry parameters will therefore correspond to a voltage level threshold that is different from the voltage level threshold to which the original parameter corresponds. According to the voltage level threshold set by the controller, the control circuit inside the flash memory 120 can determine bit(s) in the flash memory 120 as logic 1 or logic 0, and accordingly send the determined logic value back to the controller.

Based on the method 200 illustrated by FIG. 2, architecture shown in FIG. 1 can significantly improve the error correction performance. Data used in the hard decoding could be wholly or partially reserved for soft decoding, which allows the architecture shown in FIG. 1 to rapidly perform soft decoding according to the data loaded from the volatile memory as there is no need to wait for the read result of the flash memory 120. As the retry parameter does not need to be configured to the flash memory 120 during the soft decoding, the present invention saves time and the performance is improved.

Figure 3:
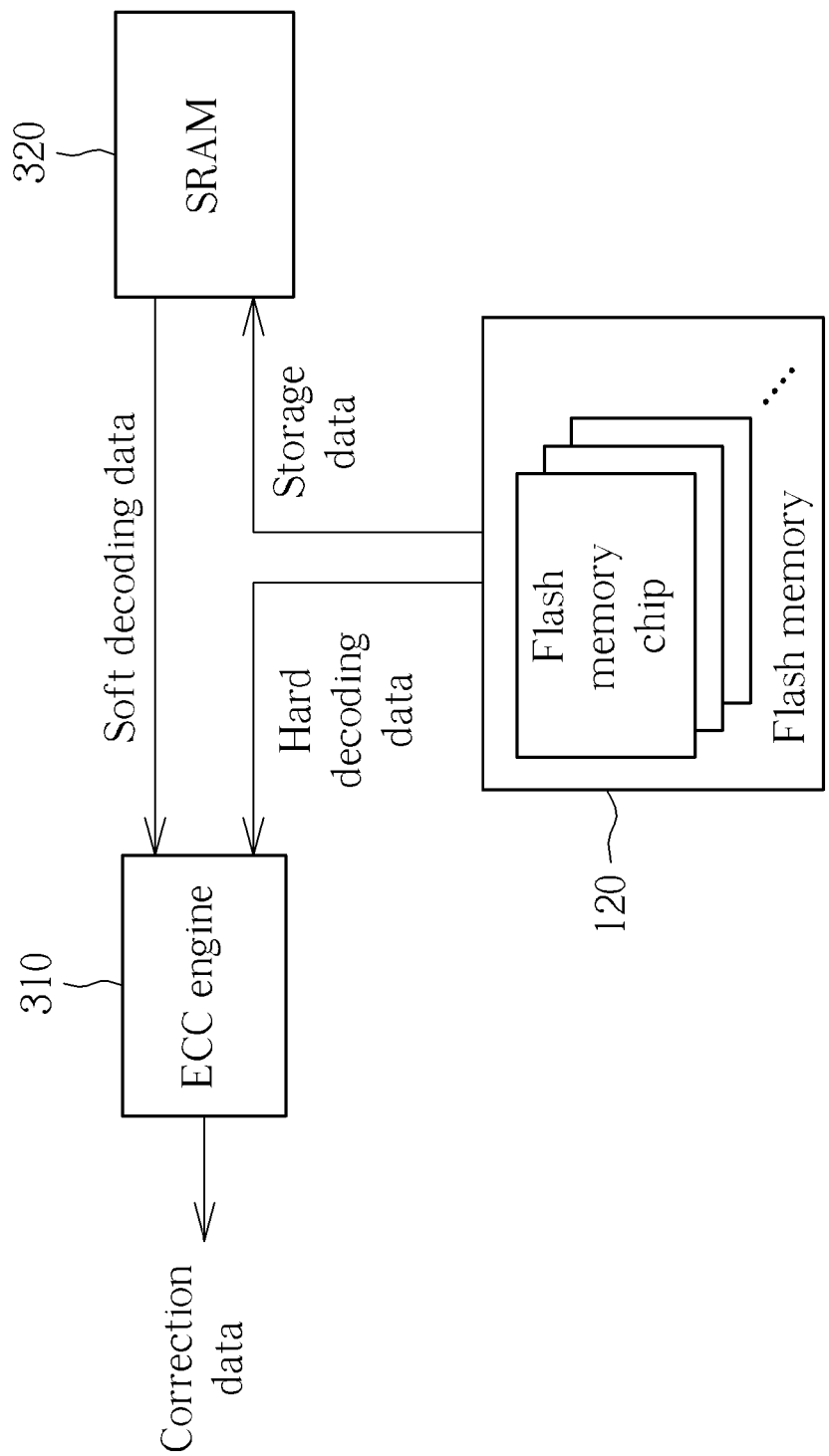
FIG. 3 illustrates a static RAM (SRAM) that relates to the method of FIG. 2 and corresponding data stream according to one embodiment of the present invention.

FIG. 3 illustrates a static RAM (SRAM) 320 according to the method of FIG. 2 and a corresponding data stream according to one embodiment of the present invention. The SRAM 320 could be an example of the RAM mentioned above, and the ECC engine 310 could be an example of the ECC engine mentioned above. As shown in FIG. 3, the flash memory 120 could include multiple flash memory chips. Under the control of the controller, the hard decoding data could be stored into the SRAM 320, and could be later read during the soft decoding period as soft decoding data. Based on the method 200 illustrated in FIG. 2, the ECC engine 310 generates correction data. Similarities between this embodiment and previously mentioned embodiments (or their modifications) are not described here for the sake of brevity.

Figure 4:
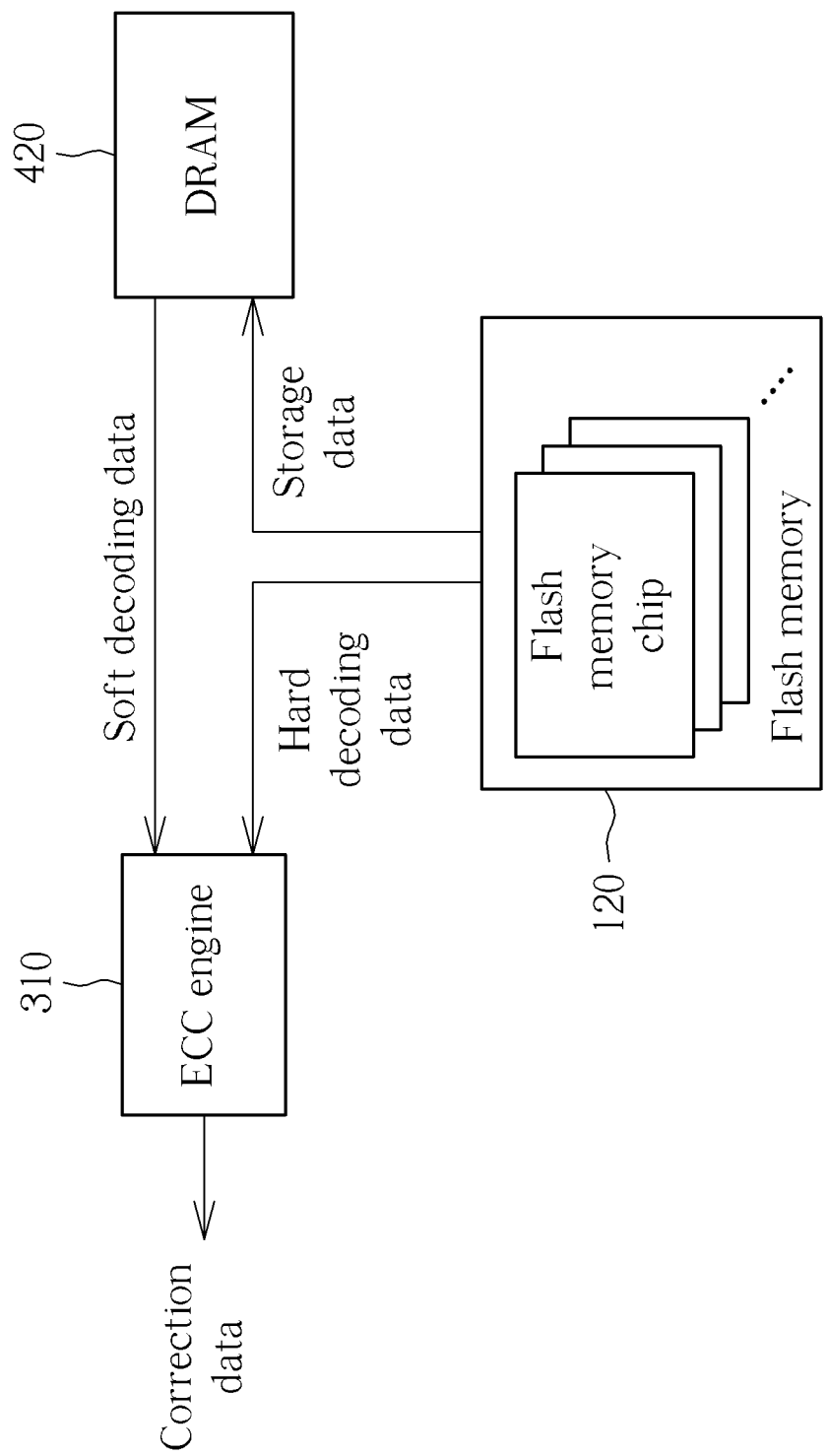
FIG. 4 illustrates a dynamic RAM (DRAM) that relates to the method of FIG. 2 and corresponding data stream according to one embodiment of the present invention.

FIG. 4 illustrates a dynamic RAM (DRAM) 420 according to the method of FIG. 2 and a corresponding data stream according to another embodiment of the present invention. The SRAM 420 could be an example of the RAM as mentioned above. Under the control of the controller, the hard decoding data could be stored into the SRAM 420, and could be later read during the soft decoding period as the soft decoding data. Based on the method 200 illustrated in FIG. 2, the ECC engine 310 generates correction data. Similarities between this embodiment and previously mentioned embodiments (or their modification) are not described here for the sake of brevity.

Figure 5:
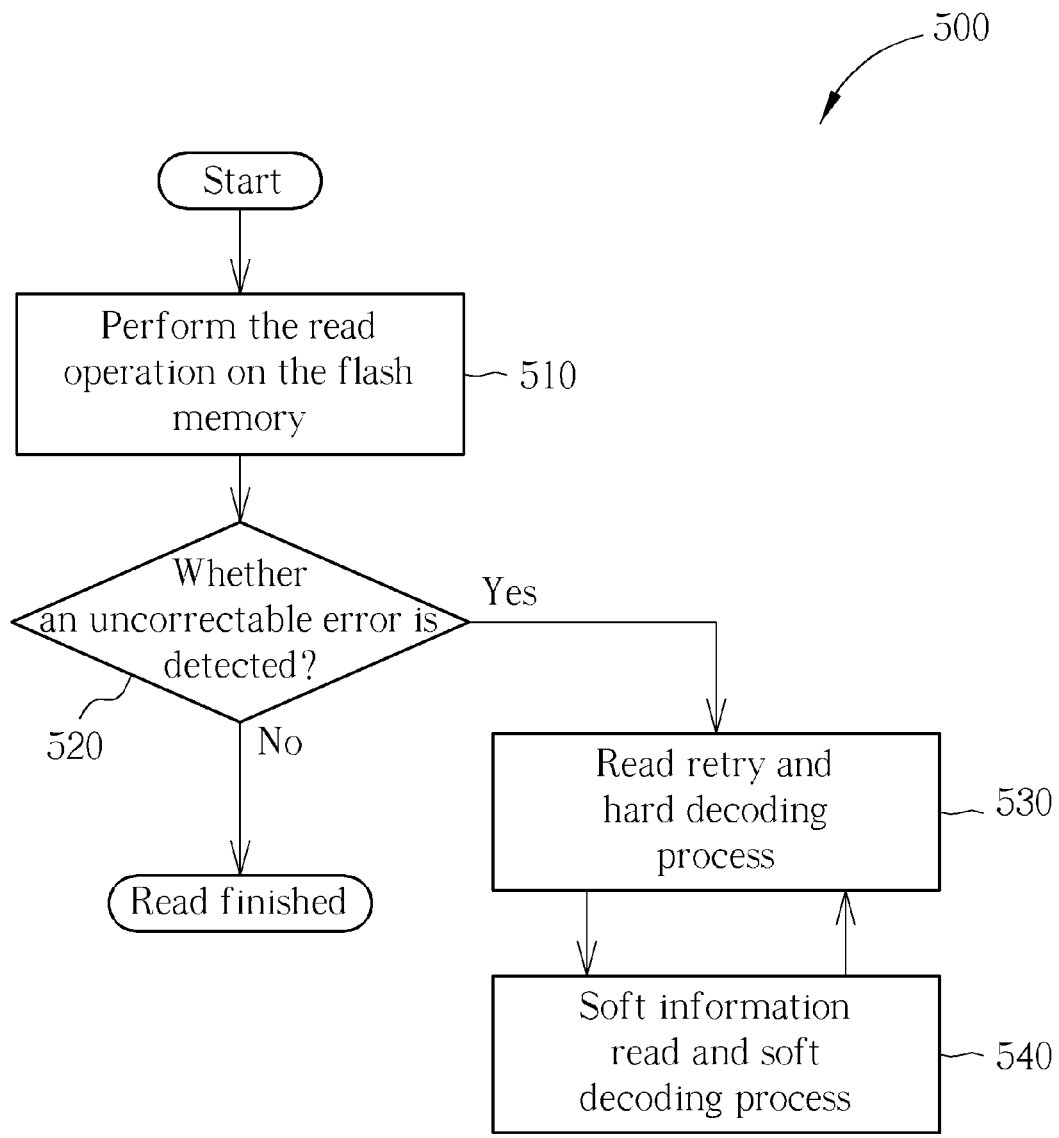
FIG. 5 illustrates a work flow of the method of FIG. 2 according to one embodiment of the present invention.

FIG. 5 illustrates a work flow 500 regarding the method shown in FIG. 2 according to one embodiment of the present invention. Based on the method 200 of FIG. 2, the architecture shown in FIG. 1 can switch between the soft decoding and the hard decoding, thereby optimizing the error correction performance. Operations in the work flow 500 are performed with respect to a same address (e.g. the above-mentioned specific address).

In step 510, the controller performs the read operation on the flash memory 120. The ECC engine 310 attempts to correct the read data. In step 520, the controller checks whether uncorrectable errors exist. When an uncorrectable error is detected, the work flow goes to a read retry and hard decoding process 530, and may further enter a soft information read and soft decoding process 540; otherwise, the work flow 500 ends, and the read operation is finished.

If necessary, the controller can dynamically switch between the read retry and hard decoding process 530 and the soft information read and soft decoding process 540. For example, the work flow 500 can execute any step of the read retry and hard decoding process 530, in order to finish the read operation. Alternatively, the flow can execute any step of the soft information read and soft decoding process 540, in order to finish the read operation. The flow may end by executing another step of the soft information read and soft decoding process 540, in which case the read operation fails. Similarities between this embodiment and previously mentioned embodiments (or their modification) are not described here for the sake of brevity.

Figure 6:
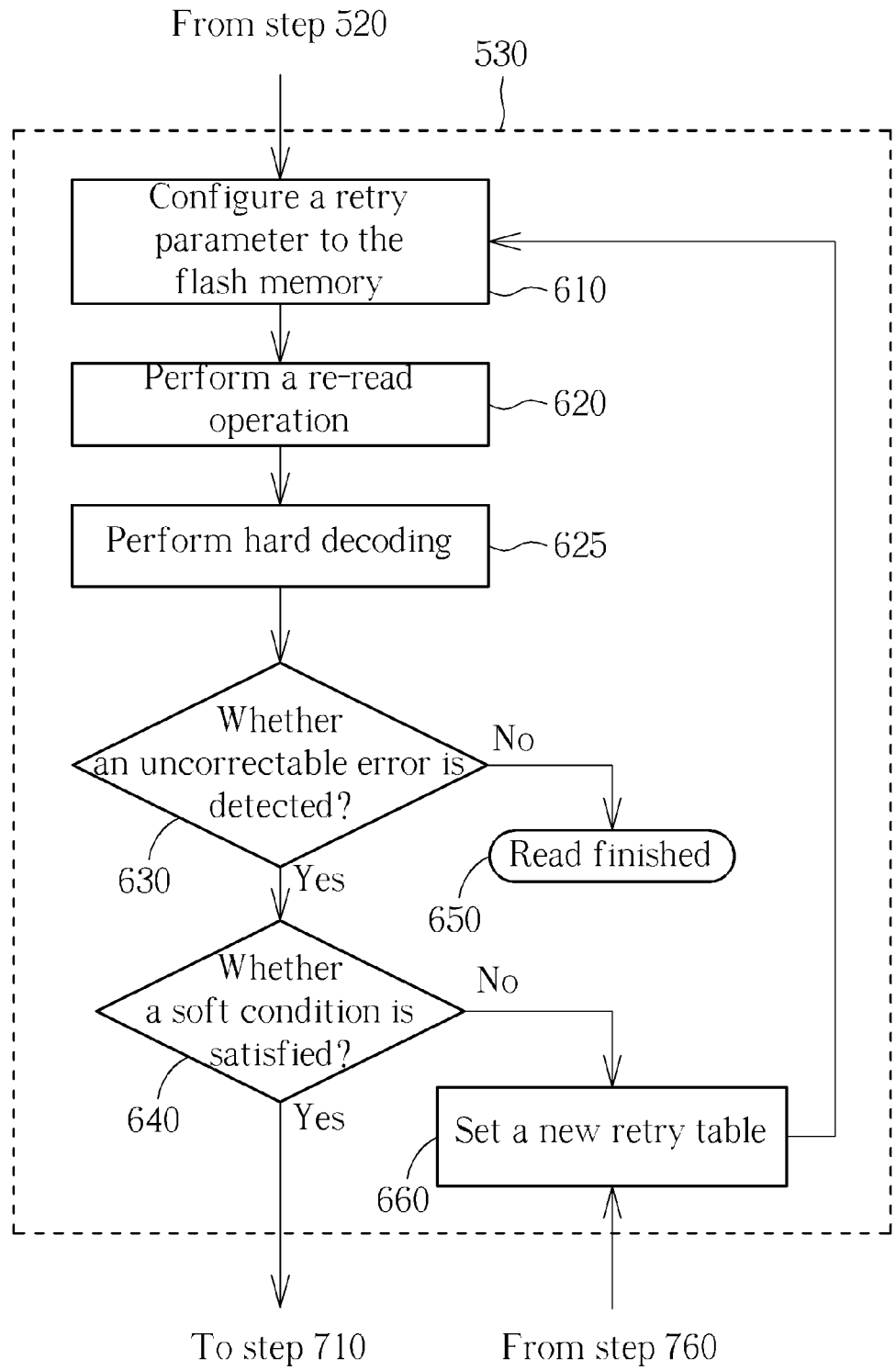
FIG. 6 details the read retry and hard decoding process of FIG. 5 according to one embodiment of the present invention.

FIG. 6 details the read retry and hard decoding process 530 of FIG. 5 according to one embodiment of the present invention. In step 610, the controller configures a retry parameter (e.g. a specific retry parameter) to the flash memory 120. In this embodiment, the controller selects one of the set of retry parameters that has not been used in the read retry and hard decoding process 530 with respect to the above-mentioned address, as the specific retry parameter. The specific retry parameter could be the first retry parameter, the second retry parameter, or the third retry parameter. Alternatively, the specific retry parameter could be a fourth retry parameter, a fifth retry parameter, or a sixth retry parameter of the set of retry parameters.

In step 620, the controller performs a re-read operation which corresponds to the specific retry parameter. For example, the re-read operation could be the first re-read operation, the second re-read operation, or the third re-read operation. Alternatively, the re-read operation could be a re-read operation that corresponds to one of the fourth retry parameter, the fifth retry parameter, and the sixth retry parameter.

In this embodiment, the controller performs the re-read operation at the above-mentioned address, to obtain specific data corresponding to the specific retry parameter, and accordingly stores the specific data into the volatile memory temporarily. For example, the specific data could be the first data, the second data, or the third data. Alternatively, the specific data could be data that corresponds to one of the fourth retry parameter, the fifth retry parameter, and the sixth retry parameter. In practice, in step 620, the controller could store the specific data corresponding to the specific retry parameter into the volatile memory according to a predetermined rule. For example, an address that the specific data is stored at could be based on the predetermined rule.

In step 625, the controller performs the hard decoding, which corresponds to the specific retry parameter. For example, the hard decoding performed by step 625 could be the first hard decoding operation, the second hard decoding operation, or the third hard decoding operation. Alternatively, it could correspond to a hard decoding operation that corresponds to one of the fourth retry parameter, the fifth retry parameter, and the sixth retry parameter.

In step 630, the controller checks whether an uncorrectable error is detected. When the uncorrectable error is detected, step 640 is entered; otherwise, step 650 is entered, and the work flow 500 ends, thereby finishing the read operation.

In step 640, the controller checks whether a soft condition (which is a condition that allows the work flow to enter a soft information read and soft decoding process 540) is satisfied. For example, after step 620 has been entered several times, the controller determines the soft condition is satisfied if data corresponding to different retry parameters in the volatile memory has been collected so that soft decoding can be performed, especially the soft decoding with respect to the above-mentioned address that has not been tried in the soft information read and soft decoding process 540. Accordingly, the controller can dynamically switch to the soft information read and soft decoding process 540. When the soft condition is satisfied, step 710 is entered; otherwise, step 660 is entered.

In step 660, the controller sets a new retry table, which provides a reference for determining whether to select one of the set of retry parameters as the specific retry parameter after step 610 is re-entered. For example, the controller can record retry parameters that have been used with respect to the above-mentioned address on the newest retry table. Alternatively, the controller can record retry parameters that have not ever been used with respect to the above-mentioned address on the newest retry table.

Figure 7:
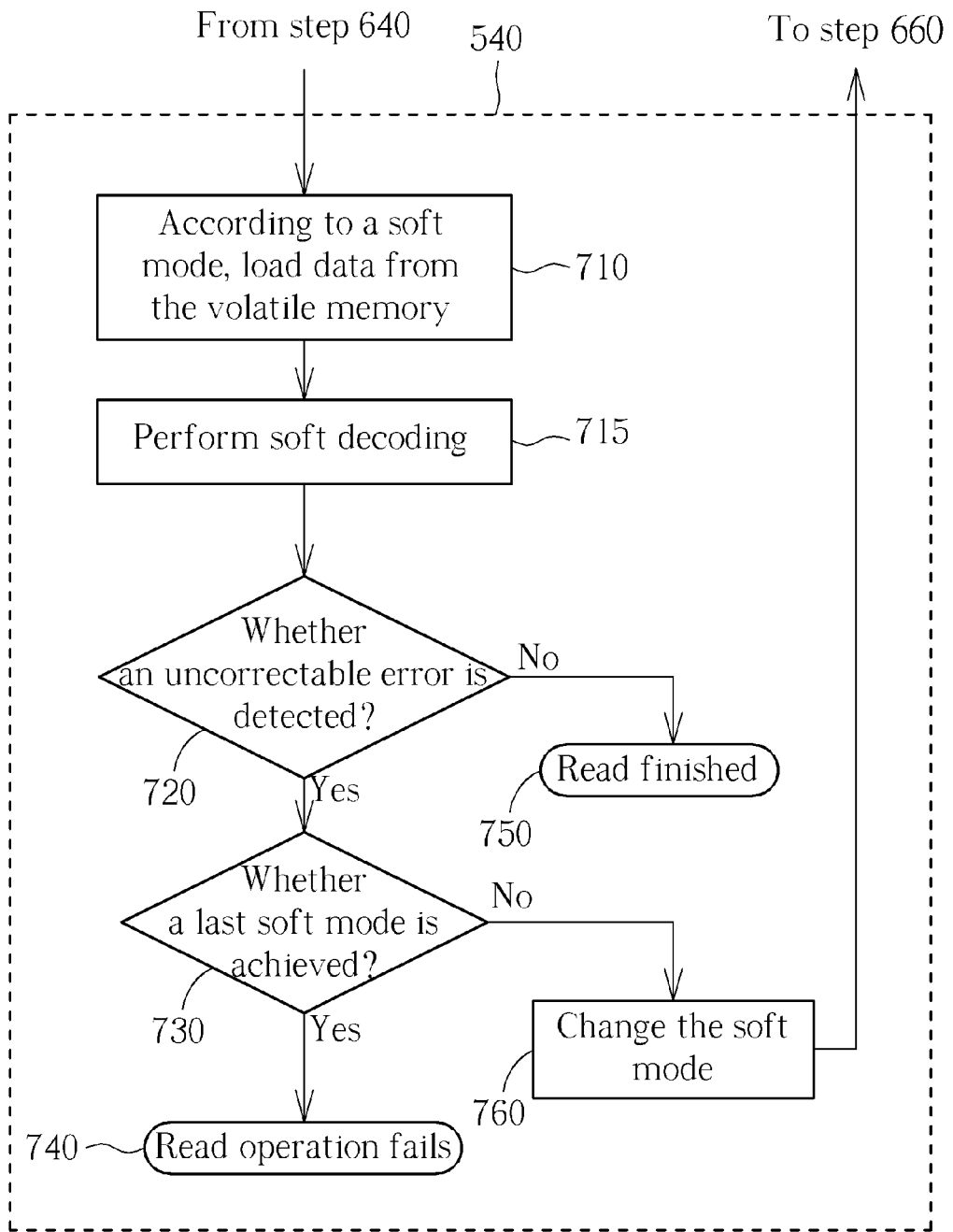
FIG. 7 details the soft information read and soft decoding process of FIG. 5 according to one embodiment of the present invention.

FIG. 7 details how the soft information read and soft decoding process 540 of FIG. 5 is implemented in the embodiment of FIG. 6. In step 710, according to a soft mode, such as a current soft mode, the controller loads data from the volatile memory, wherein the controller could utilize a soft mode index to represent the soft mode, and each possible value in the soft mode index could respectively represent a plurality of soft modes. For example, the current soft mode could correspond to a certain quantity of retry parameters, and the controller loads data corresponding to those retry parameters from the volatile memory. Alternatively, the current soft mode could correspond to some of the set of retry parameters, and the controller loads data corresponding to those retry parameters from the volatile memory.

In step 715, the controller performs the soft decoding. Particularly, the controller performs the soft decoding at least according to the data loaded in step 710. The soft decoding performed in step 715 could be an example of the soft decoding operation of step 230. In step 720, the controller checks whether an uncorrectable error exists. When the uncorrectable is checked, step 730 is entered; otherwise, step 750 is entered, and the flow 500 ends, thereby finishing the read operation.

In step 730, the controller checks whether the last soft mode is achieved. When it is checked that the last soft mode is achieved (i.e. all of the soft modes are used with respect to the above-mentioned address), step 740 is entered and the flow 500 ends, where the read operation fails; otherwise, step 760 is entered.

In step 760, the controller changes the soft mode; especially, the soft mode index. Afterwards, the controller can dynamically switch to the read retry and hard decoding flow 530.

Figure 8:
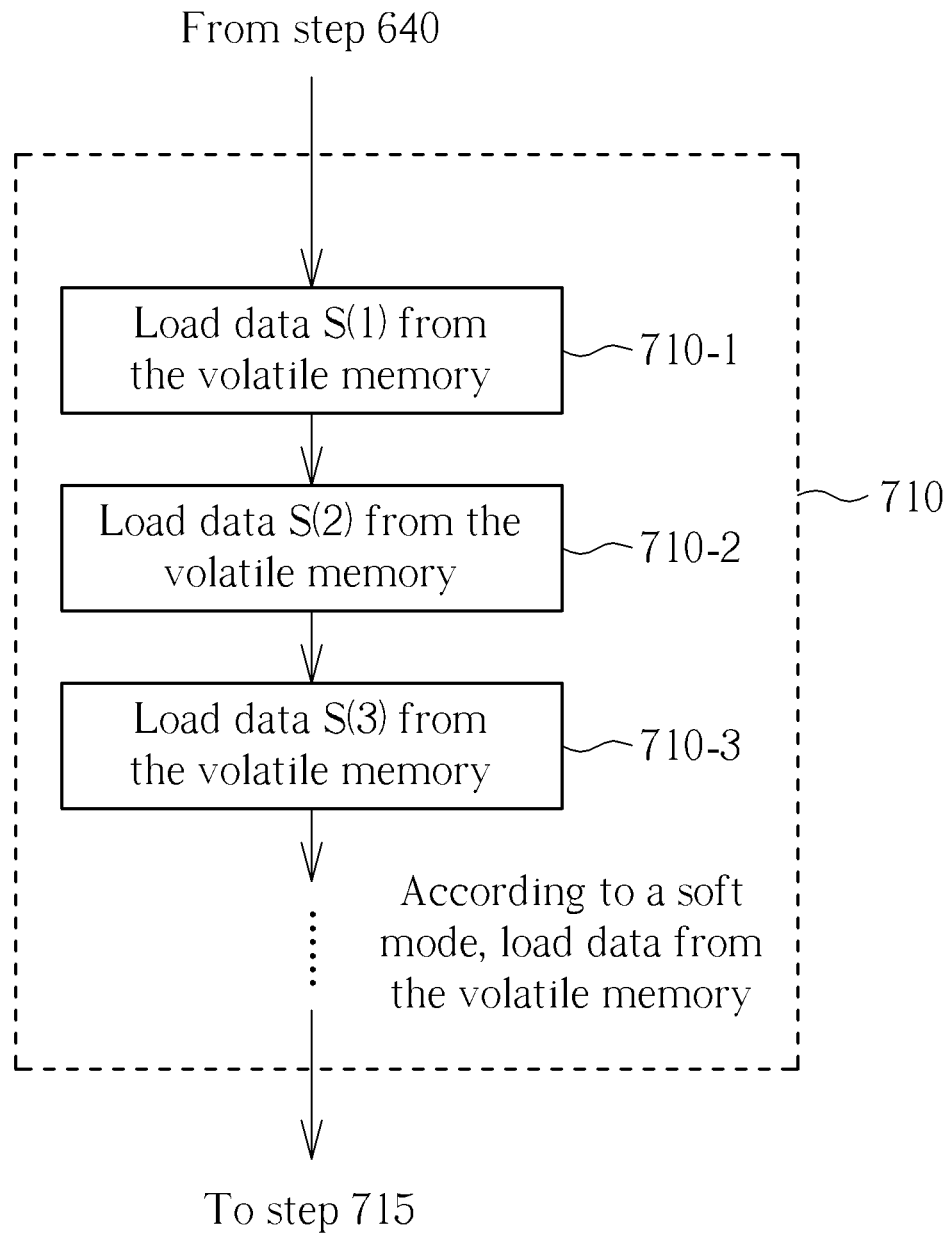
FIG. 8 details an operation of loading data from the volatile memory included in FIG. 7.

FIG. 8 details step 710 illustrated in FIG. 7. In this embodiment, according to the current soft mode indicated by the soft mode index, the controller determines what data needs to be loaded. For example, in step 710-1, the controller loads data S(1) from the volatile memory; in step 710-2, the controller loads data S(2) from the volatile memory; and in step 710-3, the controller loads data S(3) from the volatile memory. With changing of the soft mode (especially changing of the soft mode index), the data loaded from the volatile memory by the controller is changeable. For example, after step 710-3, the controller can further load other data from the volatile memory. Similarities between this embodiment and previously mentioned embodiments (or their modification) are not described here for the sake of brevity.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for use in a controller of a memory apparatus for performing error correction, the memory apparatus having a flash memory, the method comprising:

performing a read operation at a specific physical address of the flash memory;

after an uncorrectable error of the read operation is detected, performing a first re-read operation at the specific physical address of the flash memory by configuring a first retry parameter to the flash memory to obtain first data corresponding to the first retry parameter and temporarily storing the first data into a volatile memory and performing a first hard decoding operation on the first data; and after decoding failure of the first hard decoding operation is detected, at least according to the first data read from the volatile memory, performing a soft decoding operation to perform error correction corresponding to the specific physical address.

2. The method of claim 1, wherein the uncorrectable error indicates a quantity of errors in a read result of the read operation exceeds a maximum quantity of errors that an error correction code engine (ECC engine) of the memory apparatus is able to correct in the read result.

3. The method of claim 1, wherein the step of performing the read operation at the specific physical address further comprises:

performing the read operation at the specific physical address according to a host command, wherein the host command carries a logic address corresponding to the specific physical address.

4. The method of claim 1, wherein the read operation is performed based on an original parameter that is different from the first retry parameter.

5. The method of claim 4, wherein the first retry parameter and the original parameter correspond to different voltage level thresholds of the flash memory.

6. The method of claim 1, wherein the step of performing the soft decoding operation to perform the error correction corresponding to the specific physical address at least according to the first data read from the volatile memory further comprises:

while performing the error correction corresponding to the specific physical address, performing another re-read operation to prevent obtaining the first data corresponding to the first retry parameter.

7. The method of claim 6, wherein the step of performing the soft decoding operation to perform the error correction corresponding to the specific physical address at least according to the first data read from the volatile memory further comprises:

while performing the error correction corresponding to the specific physical address, re-configuring the first retry parameter to the flash memory to prevent obtaining the first data corresponding to the first retry parameter.

8. The method of claim 1, wherein the step of performing the soft decoding operation to perform the error correction corresponding to the specific physical address at least according to the first data read from the volatile memory further comprises:

after the decoding failure of the first hard decoding operation is detected, according to a set of data corresponding to a set of retry parameters, performing the soft decoding operation to perform the error correction corresponding to the specific physical address, wherein the set of retry parameters include the first retry parameter, and the set of data includes the first data read from the volatile memory.

9. The method of claim 8, wherein the soft decoding operation is performed after decoding failure of a plurality of hard decoding operations is detected, and the plurality of hard decoding operations include the first hard decoding operation.

10. The method of claim 9, wherein the set of retry parameters further include a second retry parameter, and the method further comprises:

after the uncorrectable error is detected, performing a second re-read operation at the specific physical address by configuring the second retry parameter to the flash memory, thereby obtaining second data corresponding to the second retry parameter, and temporarily storing the second data into the volatile memory, and performing a second hard decoding operation on the second data;

wherein the plurality of hard decoding operations further include the second hard decoding operation.

11. The method of claim 10, wherein the set of retry parameters further include a third retry parameter, and the method further comprises:

after the uncorrectable error is detected, performing a third re-read operation at the specific physical address by configuring the third retry parameter to the flash memory, thereby obtaining third data corresponding to the third retry parameter, and temporarily storing the third data into the volatile memory, and performing a third hard decoding operation on the third data;

wherein the plurality of hard decoding operations further include the third hard decoding operation.

12. The method of claim 8, wherein the read operation is performed based an original parameter; any retry parameter of the set of retry parameters is different from the original parameter; and each retry parameter of the set of retry parameters differs from each other.

13. A memory apparatus, comprising:

a flash memory, having a plurality of blocks; and a controller, for accessing the flash memory, wherein the controller performs a read operation at a specific physical address of the flash memory; after an uncorrectable error of the read operation is detected, the controller performs a first re-read operation at the specific physical address of the flash memory by configuring a first retry parameter to the flash memory to obtain first data corresponding to the first retry parameter; and the controller temporarily stores the first data into a volatile memory and performs a first hard decoding operation on the first data;

wherein after decoding failure of the first hard decoding operation is detected, at least according to the first data read from the volatile memory, the controller performs a soft decoding operation to perform error correction corresponding to the specific physical address.

14. The memory apparatus of claim 13, wherein the uncorrectable error indicates a quantity of errors in a read result of the read operation exceeds a maximum quantity of errors that an error correction code engine (ECC engine) of the memory apparatus is able to correct in the read result.

15. The memory apparatus of claim 13, wherein the controller performs the read operation at the specific physical address according to a host command, and the host command carries a logic address corresponding to the specific physical address.

16. The memory apparatus of claim 13, wherein the read operation is performed based on an original parameter; and the first retry parameter is different from the original parameter.

17. A controller of a memory apparatus that is used to access a flash memory having a plurality of blocks, the controller comprising:

a microprocessor, for executing a program code to control access to the flash memory, wherein the program code is loaded from outside of the controller or inside of the controller; and an error correction code engine (ECC engine), for performing error correction operations;

wherein the controller performs a read operation at a specific physical address of the flash memory; after an uncorrectable error of the read operation is detected, the controller performs a first re-read operation at the specific physical address of the flash memory by configuring a first retry parameter to the flash memory to obtain first data corresponding to the first retry parameter; and the controller temporarily stores the first data into a volatile memory and performs a first hard decoding operation on the first data by utilizing the ECC engine; after decoding failure of the first hard decoding operation is detected, at least according to the first data read from the volatile memory, the controller performs a soft decoding operation to perform error correction corresponding to the specific physical address by utilizing the ECC engine.

18. The controller of claim 17, wherein the uncorrectable error indicates a quantity of errors in a read result of the read operation exceeds a maximum quantity of errors that the ECC engine of the memory apparatus is able to correct in the read result.

19. The controller of claim 17, wherein the controller performs the read operation at the specific physical address according to a host command, and the host command carries a logic address corresponding to the specific physical address.

20. The controller of claim 17, wherein the read operation is performed based on an original parameter; and the first retry parameter is different from the original parameter.

* * * * *